(12) United States Patent
Xu

(10) Patent No.: US 6,829,313 B1
(45) Date of Patent: Dec. 7, 2004

(54) SLIDING WINDOW TURBO DECODER

(75) Inventor: Shuzhan J. Xu, Franklin Park, NJ (US)

(73) Assignee: Motorola, Inc., Schaumburg, IL (US)

( * ) Notice: Subject to any disclaimer, the term of this patent is extended or adjusted under 35 U.S.C. 154(b) by 921 days.

(21) Appl. No.: 09/617,194

(22) Filed: Jul. 17, 2000

(51) Int. Cl.[7] .............................................. H04L 27/06
(52) U.S. Cl. ........................ 375/341; 375/265; 375/262; 714/795
(58) Field of Search ................................. 375/341, 265, 375/262, 348, 259, 296, 340, 242; 714/781, 796, 776, 209, 786, 793, 795; 370/342

(56) References Cited

U.S. PATENT DOCUMENTS

| | | | |
|---|---|---|---|
| 5,933,462 A | * | 8/1999 | Viterbi et al. ............... 375/341 |
| 6,381,728 B1 | * | 4/2002 | Kang ........................ 714/781 |
| 6,484,283 B2 | * | 11/2002 | Stephen et al. ............ 714/786 |

* cited by examiner

Primary Examiner—Shuwang Liu
Assistant Examiner—Ted Wang
(74) Attorney, Agent, or Firm—Brian M. Mancini; Randall S. Vaas

(57) ABSTRACT

Decoding signals represented by a trellis of a block length divided into windows includes a step of decoding a portion of the trellis using backward recursion starting from a point that is after the end of a window backwards to the end of the window, defining a learning period, to determine a known state metric at the end of the window. A length of the learning period for each window dependents on the signal quality such that a shorter learning period is chosen for a higher signal quality. The signal quality used is an intrinsic signal-to-noise ratio derived from the log-likelihood-ratio of the soft outputs of the decoded window. In particular, the intrinsic signal-to-noise ratio of the signal is defined as a summation of generated extrinsic information multiplied by a log-likelihood-ratio (LLR) value at each iteration.

20 Claims, 9 Drawing Sheets

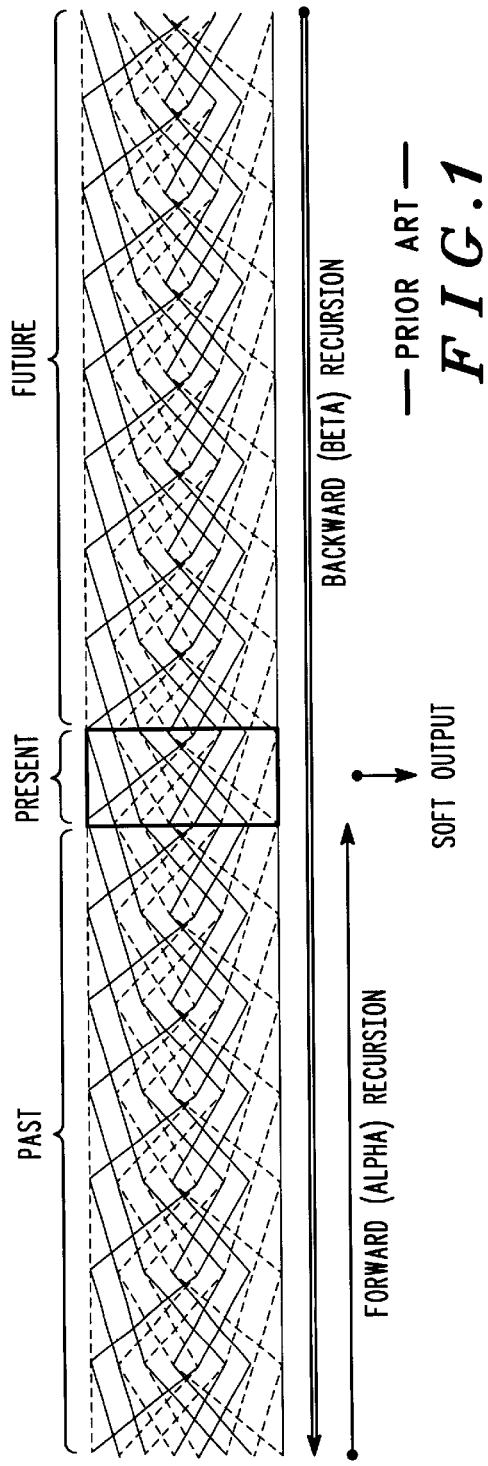
FIG.1 —PRIOR ART—
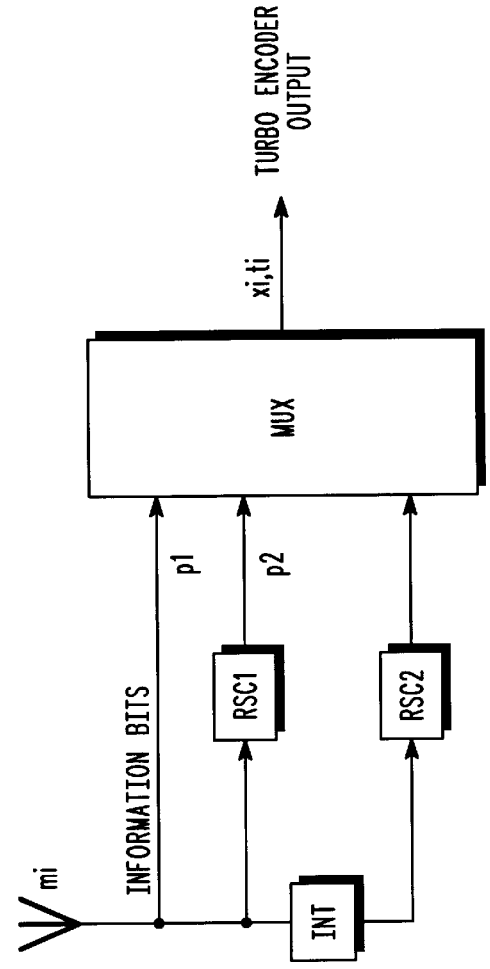
FIG.2 —PRIOR ART—

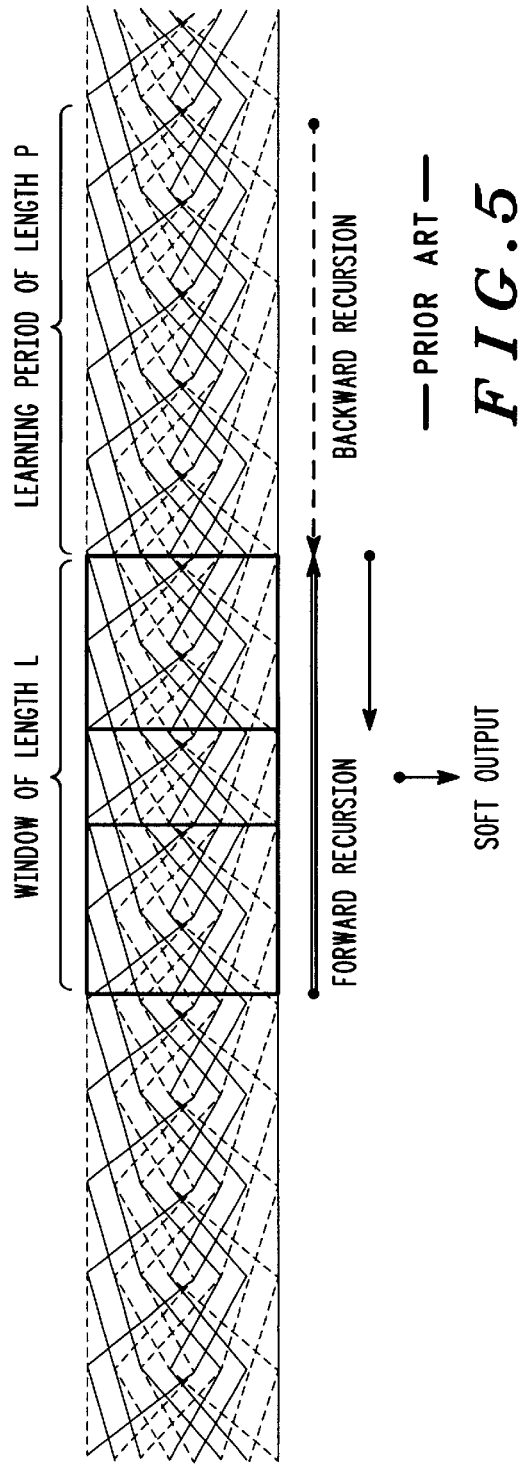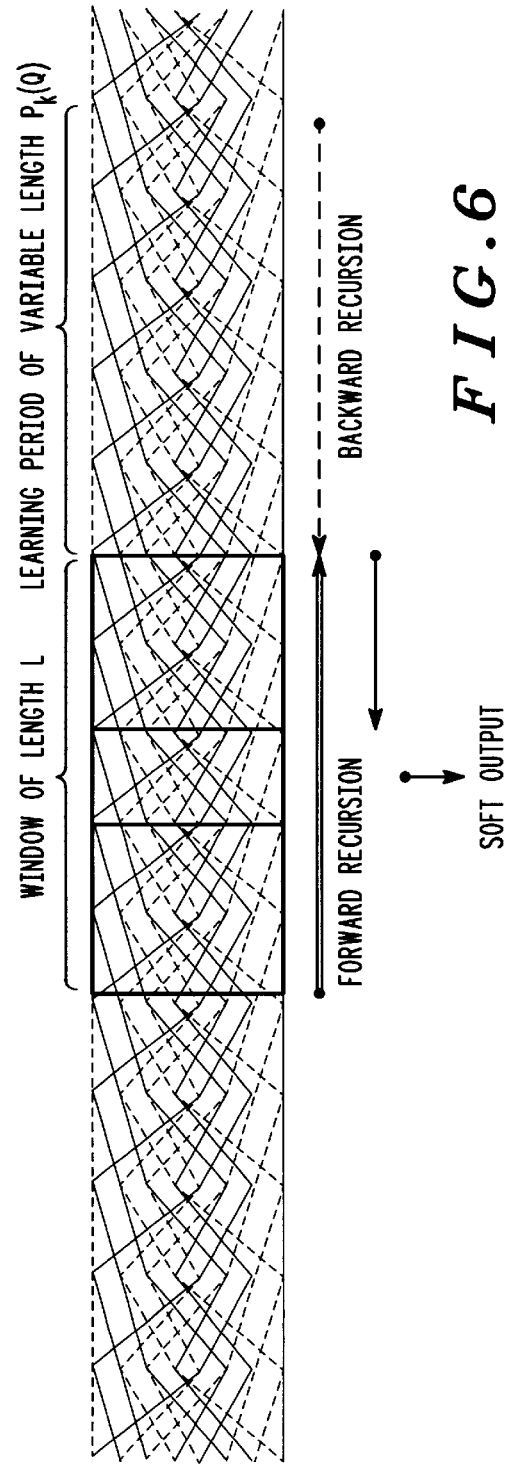

SLIDING WINDOW TURBO DECODER

FIELD OF THE INVENTION

This invention relates generally to communication systems, and more particularly to a soft output decoder for use in a receiver of a convolutional code communication system.

BACKGROUND OF THE INVENTION

Convolutional codes are often used in digital communication systems to protect transmitted information from error. At the transmitter, an outgoing code vector may be described using a trellis diagram whose complexity is determined by the constraint length of the encoder. Although computational complexity increases with increasing constraint length, the robustness of the coding also increases with constraint length.

At the receiver, a practical soft-decision decoder, such as a Viterbi decoder as is known in the art, uses the trellis structure to perform an optimum search for the maximum likelihood transmitted code vector. The Viterbi algorithm, however, is computationally complex, and its complexity increases exponentially with increasing constraint length. This essentially means that a Viterbi decoder requires a significant amount of memory and processing power for convolutional codes with large constraint lengths.

More recently, turbo codes have been developed for various communications systems, such as Direct Sequence Code Division Multiple Access (DS-CDMA) standard IS-95 and Global System for Mobile Communications (GSM), that outperform conventional coding techniques. Turbo coding is efficiently utilized to correct errors in the case of communicating over an added white Gaussian noise (AWGN) channel. Turbo codes are generally composed of two or more convolutional codes and turbo interleavers. Turbo decoding is iterative and uses a soft output decoder to decode the individual convolutional codes. The soft output decoder provides information on each bit position which helps the soft output decoder decode the convolutional codes. The soft output decoder is usually a MAP (maximum a posteriori) or soft output Viterbi algorithm (SOVA) decoder which requires backward and forward recursion decoding to determine the soft output over the block as is known in the art.

A direct implementation of MAP-based Turbo decoder requires a large memory for the storage of the recursive sequences. For example, in future standards such as the 3GPP (third generation partnership project for wireless systems), an 8-state turbo code with a block length of N=5120, needs 40960 words of intermediate storage which may be unacceptable. Any additional capabilities in future systems will require even more memory due to a larger frame and greater number of states.

Sliding window techniques have been proposed to reduce the amount of memory with the introduction of extra computation. This is the typical trade off between memory and computation. In particular, the sliding block technique divides a block of code into windows and operates on only one window at a time and outputting the code for that window. In this way a smaller sized memory is needed. However, an additional learning computation is needed for each window in order to determine the correct states at either end of the window for proper decoding. Therefore, the sliding window technique uses less memory, but with additional computations.

There is a need for an improvement to the sliding window technique of turbo decoding that retains the minimized memory requirement while reducing overall processing requirements for decoding convolutional codes without sacrificing performance. There is also a need to provide decoding capability in a portable radio communication device while reducing power consumption. In particular, it is desirable to reduce the number of iterations to save calculation time and circuit power.

BRIEF DESCRIPTION OF THE DRAWINGS

FIG. 1 shows a trellis diagram for a first prior art soft output decoder technique;

FIG. 2 shows a trellis diagram for a second prior art soft output decoder technique;

FIG. 5 shows an alternate expanded graphical representation of the diagram of FIG. 3;

FIG. 6 shows a trellis diagram for a soft output decoder technique;

DETAILED DESCRIPTION OF THE PREFERRED EMBODIMENT

Figure 3:
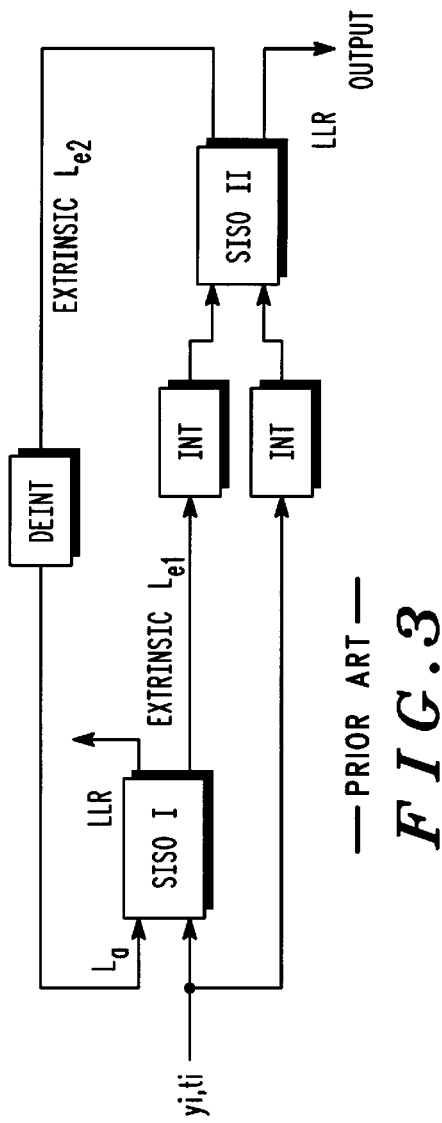
FIG. 3 shows a trellis diagram for a third prior art soft output decoder technique.

The present invention improves the sliding window technique of turbo decoding by shrinking successive learning periods needed for reliable computation as iteration proceeds through windows in a block of code. In this way, the memory requirement is maintained, while the number of iterations is reduced, thereby reducing computations and overall power consumption. The quality of the signal is utilized to adjust the size of the learning period wherein, with an improved signal quality, the learning period can be reduced. Moreover, since improved signal quality is present there in no sacrificing performance.

Intuitively, there are a few ways to examine and evaluate the error correcting performance of the turbo decoder. One observation is that a magnitude of log-likelihood ratio (LLR) for each information bit in the iterative portion of the decoder increases as iterations go on. This improves the probability of the correct output decisions. The LLR magnitude increase is directly related to the number of iterations in the turbo decoding process. The appropriate number of iterations for a reliably turbo decoded block varies as the quality of the incoming signal and the resulting number of errors incurred therein. In other words, the number of iterations needed is related to channel conditions, where a noisier environment will need more iterations to correctly resolve the information bits and reduce error. Therefore, for a higher quality signal, less learning is required in the sliding window technique.

Typically, block codes, convolutional codes, turbo codes, and others are graphically represented as a trellis as shown in FIG. 1 wherein an eight state, sixteen section trellis is shown. For convenience, we will reference M states per trellis section (typically M equals eight states) and N trellis sections per block or frame (typically N-5000). Maximum a posteriori type decoders (log-MAP, MAP, max-log-MAP, constant-log-MAP, etc.) utilize forward and backward generalized Viterbi recursions on the trellis in order to provide soft outputs, as is known in the art. The MAP decoder minimizes the decoded bit error probability for each information bit based on all received bits. Typical prior art MAP decoders require a memory for use in decoding.

Because of the Markov nature of the encoded sequence (wherein previous states cannot affect future states or future output branches), the MAP bit probability can be broken into the past (beginning of trellis to the present state), the present state (branch metric for the current value), and the future (end of trellis to current value). More specifically, the MAP decoder performs forward and backward recursions up to a present state wherein the past and future probabilities are used along with the present branch metric to generate an output decision. The principles of providing hard and soft output decisions are known in the art, and several variations of the above described decoding methods exist. For example, most of the soft input-soft output SISO decoders considered for turbo codes are based on the prior art MAP algorithm in a paper by L. R. Bahl, J. Cocke, F. Jelinek, and J. Raviv entitled "Optimal Decoding of Linear Codes for Minimizing Symbol Error Rate", IEEE Transactions on Information Theory, Vol. IT-20, March 1974, pp. 284–7 (BCJR algorithm).

FIG. 2 shows a typical turbo coder constructed with interleavers and constituent codes which are usually systematic convolutional codes, but can be block codes also. In general, a turbo coder is a parallel concatenation of two recursive systemic convolutional encoders (RSC1, RSC2) with an interleaver (INT) between them. The output of the turbo encoding is generated by multiplexing (concatenating) the information bits $m_i$ and the parity bits $p_i$ from the two encoders, RSC1 and RSC2. Optionally, the parity bits can be punctured as is known in the art to increase code rate (i.e., a throughput of ½). The turbo encoded signal is then transmitted over a channel. Noise, $n_j$, due to the AWGN nature of the channel becomes added to the signal, $x_j$, during transmission. The noise variance of the AWGN can be expressed as $\sigma^2 = N_0/2$, where $N_0/2$ is the two sided noise power spectrum density. The noise increases the likelihood of bit errors when a receiver attempts to decode the input signal, $y_j(=x_j+n_j)$, to obtain the original information bits $m_i$. Correspondingly, noise affects the transmitted parity bits to provide a signal $t_j=p_j+n_j$.

FIG. 3 shows a typical prior art turbo decoder that is constructed with interleavers (INT), de-interleavers (DEINT), and decoders (SISO). The mechanism of the turbo decoder regarding extrinsic information $L_{e1}$, $L_{e2}$, interleaver, de-interleaver, and the iteration process between the soft-input, soft-output decoder sections SISO1 and SISO2 follow the BCJR algorithm. Assuming zero decoder delay in the turbo decoder, the first decoder (SISO1) computes a soft output from the input signal bits, $y_i$, and the a priori information ($L_a$), which will be described below. The soft output is denoted as $L_{e1}$, for extrinsic data from the first decoder. The second decoder (SISO2) is input with interleaved versions of $L_{e1}$ (the a priori information from $L_a$), the input signal bits $y_i$. The second decoder generates extrinsic data, $L_{e2}$, which is deinterleaved to produce $L_a$ which is fed back to the first decoder, and a soft output (typically a MAP LLR) provide a soft output of the original information bits $m_i$. Typically, the above iterations are repeated for a fixed number of times (usually sixteen) for each bit until all the input bits are decoded.

MAP algorithms minimize the probability of error for an information bit given the received sequence, and they also provide the probability that the information bit is either a 1 or 0 given the received sequence. The prior art BCJR algorithm provides a soft output decision for each bit position (trellis section of FIG. 1) wherein the influence of the soft inputs within the block is broken into contributions from the past (earlier soft inputs), the present soft input, and the future (later soft inputs). The BCJR decoder algorithm uses a forward and a backward generalized Viterbi recursion on the trellis to arrive at an optimal soft output for each trellis section (stage). These a posteriori probabilities, or more commonly the log-likelihood ratio (LLR) of the probabilities, are passed between SISO decoding steps in iterative turbo decoding. The LLR for each information bit is $$La_k = \ln \frac{\sum_{(m,n) \in B^1} \alpha_{k-1}(n) \gamma_k(n,m) \beta_k(m)}{\sum_{(m,n) \in B^0} \alpha_{k-1}(n) \gamma_k(n,m) \beta_k(m)}, \quad (1)$$

for all bits in the decoded sequence (k=1 to N). In equation (1), the probability that the decoded bit is equal to 1 (or 0) in the trellis given the received sequence is composed of a product of terms due to the Markov property of the code. The Markov property states that the past and the future are independent given the present. The present, $\gamma_k(n,m)$, is the probability of being in state m at time k and generating the symbol $\gamma_k$ when the previous state at time k−1 was n. The present plays the function of a branch metric. The past, $\alpha_k(m)$, is the probability of being in state m at time k with the received sequence $\{y_1, \ldots, y_k\}$, and the future, $\beta_k(m)$, is the probability of generating the received sequence $\{y_{k+1}, \ldots, y_N\}$ from state m at time k. The probability $\alpha_k(m)$ can be expressed as function of $\alpha_{k-1}(m)$ and $\gamma_k(n,m)$ and is called the forward recursion $$\alpha_k(m) = \sum_{n=0}^{M-1} \alpha_{k-1}(n) \gamma_k(n,m) \quad m = 0, \ldots, M-1, \quad (2)$$

where M is the number of states. The reverse or backward recursion for computing the probability $\beta_k(n)$ from $\beta_{k+1}(n)$ and $\gamma_k(n,m)$ is $$\beta_k(m) = \sum_{n=0}^{M-1} \beta_{k+1}(m) \gamma_k(n,m) \quad n = 0, \ldots, M-1. \quad (3)$$

The overall a posteriori probabilities in equation (2) are computed by summing over the branches in the trellis $B^1$ ($B^0$) that correspond to the information bit being 1 (or 0).

The LLR in equation (1) requires both the forward and reverse recursions to be available at time k. In general, the BCJR method for meeting this requirement is to compute and store the entire reverse recursion using a fixed number of iterations, and recursively compute $\alpha_k(m)$ and $L\alpha_k$ from k=1 to k=N using $\alpha_{k-1}$ and $\beta_k$.

The disadvantage of this decoder is that the entire block of N stages must first be stored in memory before processing. Not only does this requires a large memory (N sections×M states×number of bits per state), this also causes a signal delay of length N before any information can possibly be output. In a W-CDMA system (N~5000, M=8, 13 bits) the memory required is about 0.5 Mbits. In a cdma2000 system, N is approximately 20000 which requires a memory of about 2 Mbits. For small sequence lengths, memory utilization is generally not an issue. However, for the large N where turbo codes perform the best, memory utilization is significant.

In terms of complexity, the BCJR method requires NM state updates for the reverse recursion (M state updates per trellis section, N trellis sections in the code) and provides optimal performance. In practice, a backward recursion is performed by a processor across the entire block (as represented in FIG. 1) and stored in memory. Then a forward recursion is performed by the processor and the result is used with the present state and stored future state to arrive at a soft output decision for each stage. In this case the processor operates on each state twice, once to store the backward recursion states, and once during forward recursion processing (throughput of ½).

Figure 4:
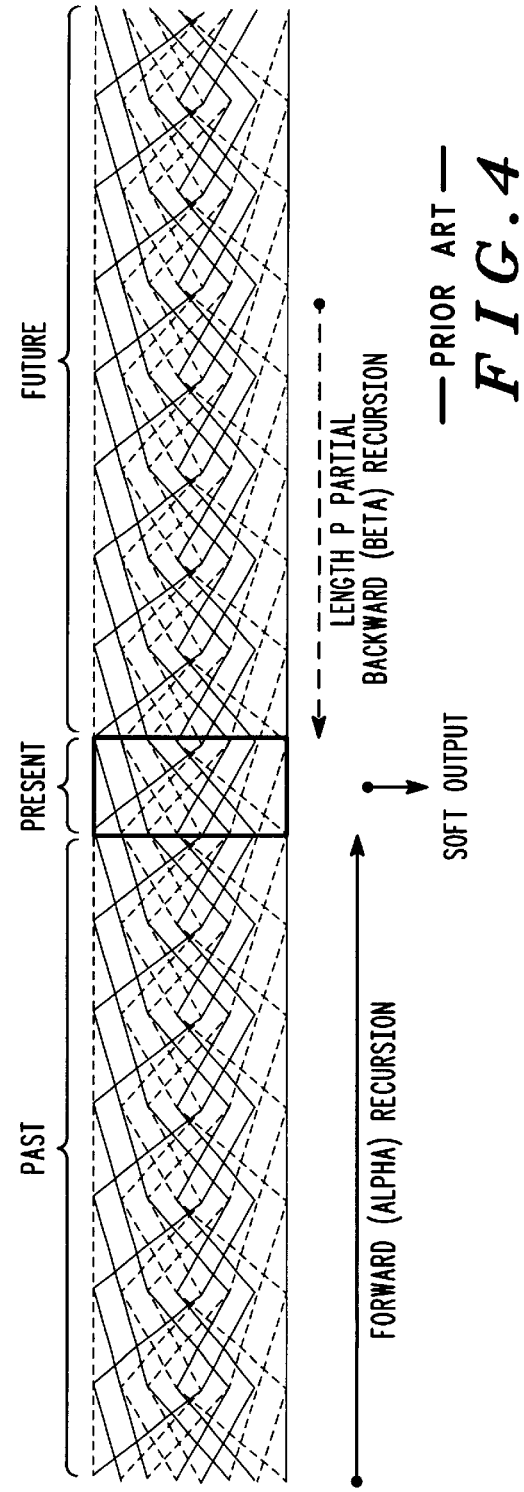
FIG. 4 shows an expanded graphical representation of the diagram of FIG. 3.

To address the memory utilization problem, a sliding window method and similar variations were developed such as described in a paper by S. Benedetto et al., "A Soft Input Soft Output Maximum A Posteriori (MAP) Module to Decode Parallel and Serial Concatenated Codes", JPL, TDA Progress Report 42–127, Nov. 15, 1996, as represented in FIG. 4 (in the figures that follow a solid arrow represents an output provided with recursion but no storage, a dotted arrow represents a learning period with no output and no storage, and a hollow arrow represents a stored recursion with no output, with the direction of the arrows indicating forward or backward recursions). An assumption that all states at a time t+P are equally probable (or unknown) is used for the backward recursion. Normally, to use this assumption the learning period P must be several constraint lengths of the constituent code in order to provide near-optimal performance. Making the learning period too small can introduce noticeable performance degradation, similar to the effects of 'finite' traceback in the conventional Viterbi algorithm.

The sliding window technique requires less memory, but is computationally complex. Specifically, instead of an entire backward recursion being performed and stored, only a partial backward recursion is performed to determined each state. For each present state, the algorithm initializes the future recursion at a learning period of P away from the present state with the initial state unknown. The future probabilities are calculated backward from the unknown future point, not from the known end of the trellis. The length P (learning period) is set such that by the time the partial backward recursion reaches the present state, the future probabilities are most likely correct. P depends on the rate and constraint length of the code and the expected channel conditions. For example, given an 8-state decoder with a ½ rate convolutional code, P is typically between 16 to 32, wherein P is some multiple of constraint lengths. The disadvantage of this decoder is that the partial backward recursion is started with equally likely (unknown states) and is allowed to iterate until it reaches the present window. This is a sub-optimal algorithm as the sliding window causes degradation from true MAP performance, as in the effects of finite traceback in a conventional Viterbi algorithm, increasing the probability of decoded bit error. Also, the processor requires P times the complexity which can only be reduced by adding more processing.

The sliding window method can be summarized as, for t=1 to N, compute the backward recursion starting at time t+P to time t, and compute $\alpha_t(m)$ and $\Lambda_t$ from $\alpha_{t-1}(m)$ and $\beta_t$. The sliding window method reduces the memory requirement from NM as needed in the BCJR method down to a less significant amount of memory needed for a recursion. Assuming double buffering, the amount of memory is only 2M. However, to achieve this memory saving, the computational complexity for the backward recursion increases by a factor of P. The sliding window method is also sub-optimal due to the 'finite' window size.

Another prior art decoder, described in U.S. Pat. No. 5,933,462 to Viterbi et al. (and similarly in a paper of S. Pietrobon and S. Barbulescu, "A Simplification of the Modified Bahl et al. Decoding Algorithm for Systematic Convolutional Codes," Int. Symp. On Inform. Theory and its Applications, Sydney, Australia, pp. 1073–7, November 1994, revised Jan. 4, 1996 and S. Pietrobon, "Efficient Implementation of Continuous MAP Decoders and a Synchronisation Technique for Turbo Decoders," Int. Symp. On Inform. Theory and its Applications, Victoria, B.C., Canada, pp. 586–9, September 1996) describes another sliding window technique, as represented in FIG. 5.

The Viterbi sliding window method reduces the large increase in computational complexity of the prior art sliding window method by performing processing in blocks. The reverse recursion is started at time t+2L, and the reverse recursion values are stored from time t+L to time t. The forward recursion and output likelihood computation are then performed over the block of time t to time t+L. Memory is reduced from NM down to L M, while only doubling the computational complexity. The key observation of starting the recursion in an unknown state is the same as for the previous sliding window technique.

The decoder differs from the previously described sliding window technique by providing a window that slides forward in blocks rather than a symbol at a time. Specifically, a sliding window is defined having a length L which is equal to the previously described learning period P. Also, L is some multiple of the total trellis length, N, and the window slides from the beginning to the end of the trellis in steps of length L. In this way, the memory required in prior art decoders, where the entire trellis was stored, has been reduced from N to N/L (typically 3 kbits for cdma2000 and W-CDMA systems where L=32).

This decoder also uses a learning period starting from an unknown future state. Specifically, a forward recursion is performed by the processor starting from a known state at the beginning of a first window L and over the length (L) of the first window. These forward recursion states are stored. The processor then performs a backward recursion from an unknown state starting at a point that is 2L away from where the forward recursion started so as to define a known state at the end of the first window. Then the processor performs a second backward recursion starting from the known state at the end of the first window to the present state wherein information from the backward recursion and the stored forward recursion are used to generate the soft output. Once all the outputs of the first window are determined the window slides forward an amount L and the process is repeated starting from the state that was determined at the end of the first window.

The disadvantage of this decoder is that the processor operates on each state three times, although a forward and backward processor can be run concurrently such that the throughput of ½ is obtained. However, the backward recursion requires twice the complexity which can only be reduced (or the throughput increased) by adding more processing. Further, this decoder produces soft outputs in reverse order which would need to be buffered in a supplementary memory before being output. Moreover, the first backward recursion over the learning period, L, is started with equally likely (unknown states) and is allowed to iterate over the length L for each window. The length L does not vary between windows and always requires a predetermined amount of processing, independent of signal conditions.

The present invention takes advantage of the fact that turbo codes will converge faster under good channel conditions requiring a fewer number of iterations to obtain good performance. The number of iterations performed is directly proportional to the number of calculations needed and it will therefore affect power consumption. Since power consumption is of great concern in the mobile and portable radio communication devices, there is an even higher emphasis on finding a way to reduce calculations. Motivated by these reasons, the present invention provides an adaptive scheme for reducing the learning period in a sliding window turbo decoder. The present invention provides a technique to vary the length of the learning period dependent on extrinsic information from the decoder, and to accomplish this in a novel way.

Figure 7:
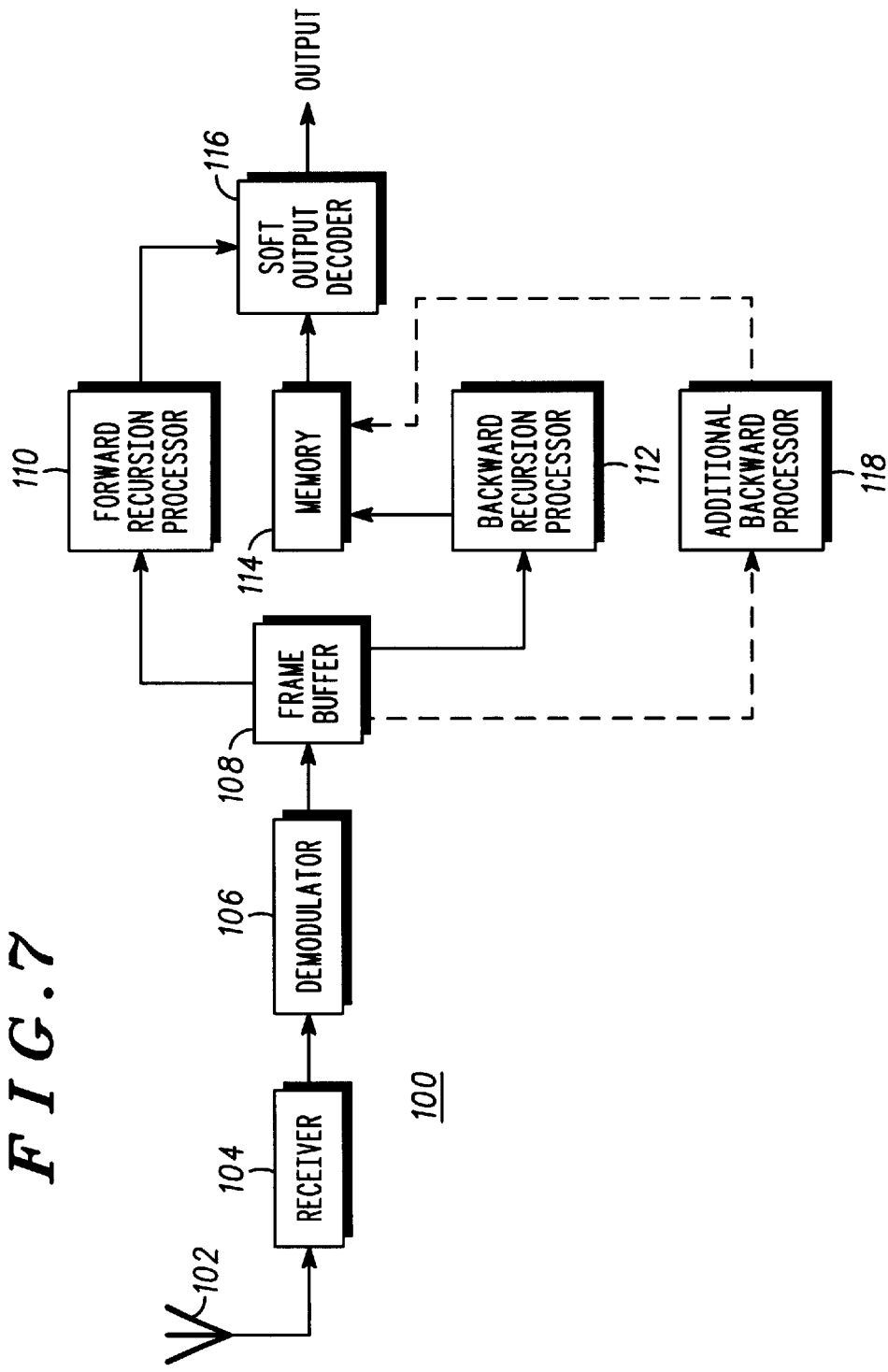
FIG. 7 shows a block diagram of a soft output decoder.

FIG. 6 shows a trellis diagram utilizing convolutional decoding in accordance with the present invention. The trellis code is obtained from a convolutionally coded sequence of signals represented by a trellis of length N in a communication system, as simplified in FIG. 7. In a radiotelephone 100, a signal travels through an antenna 102 to a receiver 104 and demodulator 106, as is known in the art. The signal is loaded into a frame buffer 108. A forward recursion processor 110 and backward recursion processor 112 operate on the block.

The present invention differs from the previously described sliding window technique of FIG. 5 by providing a variable learning (synchronization) period that can be adjusted for successive windows. Although the window sizes, L, are not required to be equal throughout the trellis, it is assumed that they are equal for purposes of explanation. In particular, a sliding window is defined having a length L such that some multiple of L equals the total trellis length, N, and the window slides from the beginning to the end of the trellis in steps of length L. This present invention uses a variable learning period, $P_k(Q)$, which is a function of Q, a signal quality index as defined below. In particular, a length of the learning period is dependent on the quality of the signal such that a shorter learning period is chosen for a higher quality signal and a longer learning period is chosen for a lower quality signal. However, in a preferred embodiment, the learning period is only shortened with increasing signal quality to result in reduced computation.

Specifically, a backward learning recursion is performed by the backward processor 112 starting from an unknown state that is an initial length $P_1(Q)$ beyond the end of a first window backward to the end of the first window to approximate and define a known state at the end of that window. Then a second backward recursion is performed by the backward processor 112, starting at the known state at the end of the first window back to the beginning of the window. The second backward recursion can be stored in a memory 114. In addition, the forward recursion processor 110 performs a forward recursion from the known state at the beginning of the first window throughout the length of the window. The forward recursion can also be stored in a memory 114 although this is not necessary. The decoder 116 uses the information from the backward and forward recursion, as well as the present branch metrics at each symbol, to output soft output decisions.

The quality of the signal is determined from the soft outputs of the decoder. The learning period for the next window is adjusted to be shorter as the quality of the signal improves and longer if the quality of the signal worsens. However, in practice, we are only interested in shortening the learning period to reduce computations. This is not a problem in that the nature of the criteria used to determine signal quality increases as more iterations are done, as will be explained below.

At the end of the first window, the window slides forward an amount L and the process is repeated. In a preferred embodiment, an additional backward processor 118 is used in parallel with the backward processor 112 such that when the backward recursion processor 112 operates within the window the additional backward recursion processor 118 operates to decode a portion of the trellis using a learning backward recursion from a next point $P_{k+1}(Q)$ that is after the end of the next window back to the end of the next window. Also, when the forward recursion processor 110 operates within the window the additional backward recursion processor 118 decodes the portion of the trellis within the next window using backward recursion from the known state at the end of the next window back to the beginning of the next window to define a set of known backward recursion state metrics within the next window which can stored in the memory 114 as the memory is cleared, leaving the forward recursion processor 110 available to begin decoding the next window immediately after the present window is processed. Preferably, all the processors operate concurrently until all of the windows within the block are decoded. Alternatively, the two backward recursion processors can be used to first operate within the learning periods for two windows and then within the windows themselves. This can be accomplished concurrently or not.

The present invention dynamically utilizes an intrinsic (virtual) signal-to-noise ratio (SNR), as a measure quality (Q) of the signal, of the in-loop data stream at the input of each constituent decoder stage as the loop decoding iterations proceed. Since SNR improves when more bits are detected correctly per iteration, the present invention uses a detection quality indicator that observes the increase in signal energy relative to the noise as iterations proceed. This quality index is used to determine the number of iterations needed in subsequently learning periods for each window. Advantageously, by reducing the number of calculations to be performed in each learning period, the present invention conserves power in the communication device and saves calculation complexity.

Figure 8:
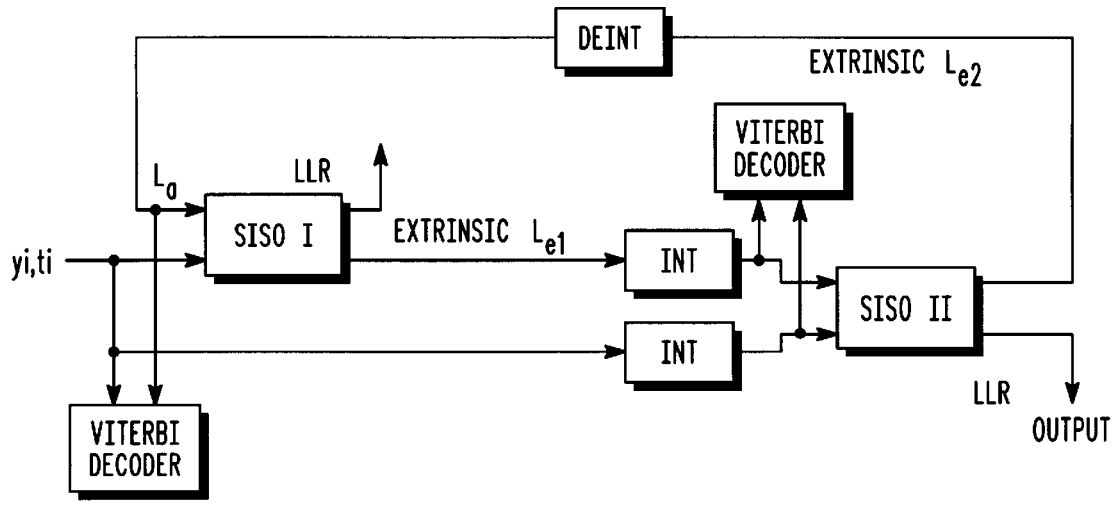
FIG. 8 shows an expanded graphical representation of the diagram of FIG. 6.

FIG. 8 shows a turbo decoder with at least one additional Viterbi decoder to monitor the decoding process, in accordance with the present invention. Although one Viterbi decoder can be used, two decoders give the flexibility to stop iterations at any SISO decoder. The Viterbi decoders are used because it is easy to analyze the Viterbi decoder to get the quality index. The Viterbi decoder is just used to do the mathematics in the present invention, i.e. to derive the quality indexes and intrinsic SNR values. No real Viterbi decoding is needed. It is well known that MAP or SOVA decoder will not outperform the conventional Viterbi decoder significantly if no iteration is applied. Therefore, the quality index also applies towards the performance of MAP and SOVA decoders. The error due to the Viterbi approximation to SISO (MAP or SOVA) will not accumulate since there is no change in the turbo decoding process itself. Note that the turbo decoding process remains as it is. The at least one additional Viterbi decoder is attached for analysis to generate the quality index and no decoding is actually needed.

In a preferred embodiment, two Viterbi decoders are used. In practice, where two identical RSC encoder are used, thus requiring identical SISO decoders, only one Viterbi decoder is needed, although two of the same decoders can be used. Otherwise, the two Viterbi decoders are different and they are both required. Both decoders generate an iteration stopping signal, and they act independently such that either decoder can signal a stop to iterations. The Viterbi decoders are not utilized in the traditional sense in that they are only used to do the mathematics and derive the quality indexes and intrinsic SNR values. In addition, since iterations can be stopped mid-cycle at any SISO decoder, a soft output is generated for the transmitted bits from the LLR of the decoder where the iteration is stopped.

The present invention utilizes the extrinsic information available in the iterative loop in the Viterbi decoder. For an AWGN channel, we have the following path metrics with the extrinsic information input:

$$p[Y \mid X] = \prod_{i=0}^{L-1} p[y_i \mid x_i] p[t_i \mid p_i] p[m_i]$$

where $m_i$ is the transmitted information bit, $x_i = m_i$ is the systematic bit, and $p_i$ is the parity bit. With $m_i$ in polarity form ($1 \to +1$ and $0 \to -1$), we rewrite the extrinsic information as $$p[m_i] = \frac{e^{z_i}}{1+e^{z_i}} = \frac{e^{z_i/2}}{e^{-z_i/2}+e^{z_i/2}}, \text{ if } m_i = +1$$

$$p[m_i] = \frac{1}{1+e^{z_i}} = \frac{e^{-z_i/2}}{e^{-z_i/2}+e^{z_i/2}}, \text{ if } m_i = -1$$

$p[m_i]$ is the a priori information about the transmitted bits, $$z_i = \log \frac{p[m_i = +1]}{p[m_i = -1]}$$

is the extrinsic information, or in general, $$p[m_i] = \frac{e^{m_i z_i/2}}{e^{-z_i/2}+e^{z_i/2}}$$

The path metric is thus calculated as $$p[X \mid Y] = \prod_{i=0}^{L-1} p[y_i \mid x_i] p[t_i \mid p_i] p[m_i]$$

$$= \left(\frac{1}{\sqrt{2\pi}\,\sigma}\right)^L e^{-\frac{1}{2\sigma^2} \sum_{i=0}^{L-1} [(x_i-y_i)^2+(p_i-t_i)^2]}$$

$$\left(\prod_{i=0}^{L-1} \frac{1}{e^{-z_i/2}+e^{z_i/2}}\right) e^{\frac{1}{2}\sum_{i=0}^{L-1} m_i z_i}$$

Note that $$e^{\frac{1}{2}\sum_{i=0}^{L-1} m_i z_i}$$

is the correction factor introduced by the extrinsic information. And from the Viterbi decoder point of view, this correcting factor improves the path metric and thus improves the decoding performance. This factor is the improvement brought forth by the extrinsic information. The present invention introduces this factor as the quality index and the iteration stopping criteria for turbo codes.

In particular, the turbo decoding quality index $Q(\text{iter}, \{m_i\}, L)$ is:

$$Q(\text{iter}, \{m_i\}, L) = \sum_{i=0}^{L-1} m_i z_i$$

where iter is the iteration number, L denote number of bits in each decoding block, $m_i$ is the transmitted information bit, and $z_i$ is the extrinsic information generated after each small decoding step. More generally, $$Q(\text{iter}, \{m_i\}, \{w_i\}, L) = \sum_{i=0}^{L-1} w_i m_i z_i$$

where $w_i$ is a weighting function to alter performance. In a preferred embodiment, $w_i$ is a constant of 1.

This index remains positive since typically $z_i$ and $m_i$ have the same polarity. In practice, the incoming data bits $\{m_i\}$ are unknown, and the following index is used instead:

$$Q_H(\text{iter}, \{m_i\}, L) = \sum_{i=0}^{L-1} \hat{d}_i z_i$$

where $\hat{d}_i$ is the hard decision as extracted from the LLR information. That is $\hat{d}_i = \text{sign}\{L_i\}$ with $L_i$ denoting the LLR value. The following soft output version of the quality index can also be used for the same purpose:

$$Q_S(\text{iter}, \{m_i\}, L) = \sum_{i=0}^{L-1} L_i z_i$$

or more generally $$Q_S(\text{iter}, \{m_i\}, \{w_i\}, L) = \sum_{i=0}^{L-1} w_i L_i z_i$$

Note that these indexes are extremely easy to generate and require very little hardware. In addition, these indexes have virtually the same asymptotic behavior and can be used as a good quality index for the turbo decoding performance evaluation and iteration stopping criterion.

The behavior of these indexes is that they increase very quickly for the first a few iterations and then they approach an asymptote of almost constant value. As can be seen from simulation results below, this asymptotic behavior describes the turbo decoding process well and serves as a quality monitor of the turbo decoding process. In operation, the iterations are stopped if this index value crosses the knee of the asymptote.

The iterative loop of the turbo decoder increases the magnitude of the LLR such that the decision error probability will be reduced. Another way to look at it is that the extrinsic information input to each decoder is virtually improving the SNR of the input sample streams. The following analysis is presented to show that what the extrinsic information does is to improve the virtual SNR to each constituent decoder. This helps to explain how the turbo coding gain is reached. Analysis of the incoming samples is also provided with the assistance of the Viterbi decoder as described before.

The path metric equation of the attached additional Viterbi decoders is $$p[Y \mid X] = \left(\frac{1}{\sqrt{2\pi}\,\sigma}\right)^L e^{\frac{1}{2\sigma^2}\sum_{i=0}^{L-1}[(x_i-y_i)^2+(p_i-t_i)^2]} \left(\prod_{i=0}^{L-1} \frac{1}{e^{-z_i/2}+e^{z_i/2}}\right) e^{\frac{1}{2}\sum_{i=0}^{L-1} m_i z_i}$$

Expansion of this equation gives $$p[Y \mid X] = \left(\frac{1}{\sqrt{2\pi}\,\sigma}\right)^{2L} \left(\prod_{i=0}^{L-1} \frac{1}{e^{-z_i/2}+e^{z_i/2}}\right) \cdot e^{\frac{1}{2\sigma^2}\sum_{i=0}^{L-1}(x_i^2+y_i^2)}$$
$$e^{\frac{1}{2\sigma^2}\sum_{i=0}^{L-1}(t_i^2+p_i^2)} e^{\frac{1}{2\sigma^2}\sum_{i=0}^{L-1}(2x_iy_i+2t_ip_i)} e^{\frac{1}{2}\sum_{i=0}^{L-1} x_i z_i}$$
$$= \left(\frac{1}{\sqrt{2\pi}\,\sigma}\right)^{2L} \left(\prod_{i=0}^{L-1} \frac{1}{e^{-z_i/2}+e^{z_i/2}}\right) \cdot e^{\frac{1}{2\sigma^2}\sum_{i=0}^{L-1}(x_i^2+y_i^2)}$$
$$e^{\frac{1}{2\sigma^2}\sum_{i=0}^{L-1}(t_i^2+p_i^2)} e^{\frac{1}{2\sigma^2}\sum_{i=0}^{L-1}(2x_iy_i+2t_ip_i)+\frac{1}{2}\sum_{i=0}^{L-1} x_i z_i}$$

Looking at the correlation term, we get the following factor $$\frac{1}{\sigma^2}\sum_{i=0}^{L-1}\left(x_iy_i + \frac{\sigma^2}{2}x_iz_i\right) + \frac{1}{\sigma^2}\sum_{i=0}^{L-1} t_i p_i =$$
$$\frac{1}{\sigma^2}\sum_{i=0}^{L-1} x_i\left(y_i + \frac{\sigma^2}{2}z_i\right) + \frac{1}{\sigma^2}\sum_{i=0}^{L-1} t_i p_i = \frac{1}{\sigma^2}\sum_{i=0}^{L-1}\left\{x_i\left(y_i+\frac{\sigma^2}{2}z_i\right)+t_ip_i\right\}$$

For the Viterbi decoder, to search for the minimum Euclidean distance is the same process as searching for the following maximum correlation.

$$\frac{1}{\sigma^2}\sum_{i=0}^{L-1}\left\{x_i\left(y_i+\frac{\sigma^2}{2}z_i\right)+t_ip_i\right\}$$

or equivalently, the input data stream to the Viterbi decoder is $$\left\{\left(y_i+\frac{\sigma^2}{2}z_i\right), t_i\right\},$$

which is graphically depicted in FIG. 5.

Following the standard signal-to-noise ratio calculation formula $$SNR = \frac{(E[y_i \mid x_i])^2}{\sigma^2}$$

and given the fact that yi=xi+ni and ti=Pi+n; (where pi are the parity bits of the incoming signal), we get SNR for the input data samples into the constituent decoder as $$SNR(x_i, y_i, iter) = \frac{\left(E\left[y_i + \frac{\sigma^2}{2}z_i \mid x_i\right]\right)^2}{\sigma^2}$$
$$= \frac{\left(E\left[x_i + n_i + \frac{\sigma^2}{2}z_i \mid x_i\right]\right)^2}{\sigma^2}$$
$$= \frac{\left(x_i + \frac{\sigma^2}{2}z_i\right)^2}{\sigma^2}$$
$$= \frac{x_i^2}{\sigma^2} + x_i z_i + \frac{\sigma^2}{4}z_i^2$$

Notice that the last two terms are correction terms due to the extrinsic information input. The SNR for the input parity samples are $$SNR(p_i, t_i, iter) = \frac{(E[t_i \mid p_i])^2}{\sigma^2} = \frac{(E[p_i+n_i' \mid p_i])^2}{\sigma^2} = \frac{p_i^2}{\sigma^2}$$

Now it can be seen that the SNR for each received data samples are changing as iterations go on because the input extrinsic information will increase the virtual or intrinsic SNR. Moreover, the corresponding SNR for each parity sample will not be affected by the iteration. Clearly, if $x_i$ has the same sign as $z_i$, we have $$SNR(x_i, y_i, iter) = \frac{\left(x_i+\frac{\sigma^2}{2}z_i\right)^2}{\sigma^2} \geq \frac{x_i^2}{\sigma^2} = SNR(x_i, y_i, iter=0)$$

This shows that the extrinsic information increased the virtual SNR of the data stream input to each constituent decoder.

The average SNR for the whole block is $$AverageSNR(iter) = \frac{1}{2L}\left\{\sum_{i=0}^{L-1} SNR(x_i, y_i, iter) + \sum_{i=0}^{L-1} SNR(p_i, t_i, iter)\right\}$$
$$= \frac{1}{2L}\left\{\sum_{i=0}^{L-1}\frac{x_i^2}{\sigma^2} + \sum_{i=0}^{L-1}\frac{p_i^2}{\sigma^2}\right\} + \frac{1}{2L}\left\{\sum_{i=0}^{L-1} x_i z_i + \frac{\sigma^2}{4}\sum_{i=0}^{L-1} z_i^2\right\}$$
$$= AverageSNR(0) + \frac{1}{2L}Q(iter, \{m_i\}, L) + \frac{\sigma^2}{4}\left(\frac{1}{2L}\sum_{i=0}^{L-1} z_i^2\right)$$

at each iteration stage.

If the extrinsic information has the same sign as the received data samples and if the magnitudes of the $z_i$ samples are increasing, the average SNR of the whole block will increase as the number of iteration increases. Note that the second term is the original quality index, as described previously, divided by the block size. The third term is directly proportional to the average of magnitude squared of the extrinsic information and is always positive. This intrinsic SNR expression will have the similar asymptotic behavior as the previously described quality indexes and can also be used as decoding quality indicator. Similar to the quality indexes, more practical intrinsic SNR values are:

$$AverageSNR_H(iter) = StartSNR + \frac{1}{2L}Q_H(iter, \{m_i\}, L) + \frac{\sigma^2}{4}\left(\frac{1}{2L}\sum_{i=0}^{L-1}z_i^2\right),$$

or a corresponding soft copy of it $$AverageSNR_S(iter) = StartSNR + \frac{1}{2L}Q_S(iter, \{m_i\}, L) + \frac{\sigma^2}{4}\left(\frac{1}{2L}\sum_{i=0}^{L-1}z_i^2\right)$$

where StartSNR denotes the initial SNR value that starts the decoding iterations. Optionally, a weighting function can be used here as well. Only the last two terms are needed to monitor the decoding quality. Note also that the normalization constant in the previous intrinsic SNR expressions has been ignored.

In review, the present invention provides a decoder that dynamically reduces learning period iteration calculations in the decoding of a received convolutionally coded signal using quality index criteria. The decoder includes a standard turbo decoder with two recursion processors connected in an iterative loop. Preferably, the at least one additional recursion processor is a Viterbi decoder, and the two recursion processors are soft-input, soft-output decoders. More preferably, there are two additional processors coupled in parallel at the inputs of the two recursion processors, respectively. All of the recursion processors, including the additional processors, perform concurrent iterative calculations on the signal. The at least one additional recursion processor calculates a quality index of the signal for each iteration and adjust the learning period of the next window to be decoded as the quality index changes.

The quality index is a summation of generated extrinsic information multiplied by a quantity extracted from the LLR information at each iteration. The quantity can be a hard decision of the LLR value or the LLR value itself. Alternatively, the quality index is an intrinsic signal-to-noise ratio of the signal calculated at each iteration. In particular, the intrinsic signal-to-noise ratio is a function of the quality index added to a summation of the square of the generated extrinsic information at each iteration. The intrinsic signal-to-noise ratio can be calculated using the quality index with the quantity being a hard decision of the LLR value, or the intrinsic signal-to-noise ratio is calculated using the quality index with the quantity being the LLR value. In practice, the measure of the quality index is a slope of the quality index taken over consecutive iterations.

The key advantages of the present invention are easy hardware implementation and flexibility of use. In other words, the present invention can be used to stop iteration at any SISO decoder, or the iteration can be stopped at half cycles. In addition, SNR is derived according to Viterbi decoding which does not use a square root operation which would require much increased circuit complexity or the use of an approximation. In contrast, the present invention has a very simple hardware implementation.

Figure 9:
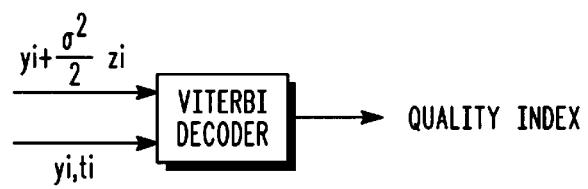
FIG. 9 shows inputs and outputs to a Viterbi decoder.

FIG. 9 illustrates an exemplary Viterbi decoder wherein the QUALITY index is derived from yi, ti on one input and yi+σ²/2.

EXAMPLE

Figure 10:
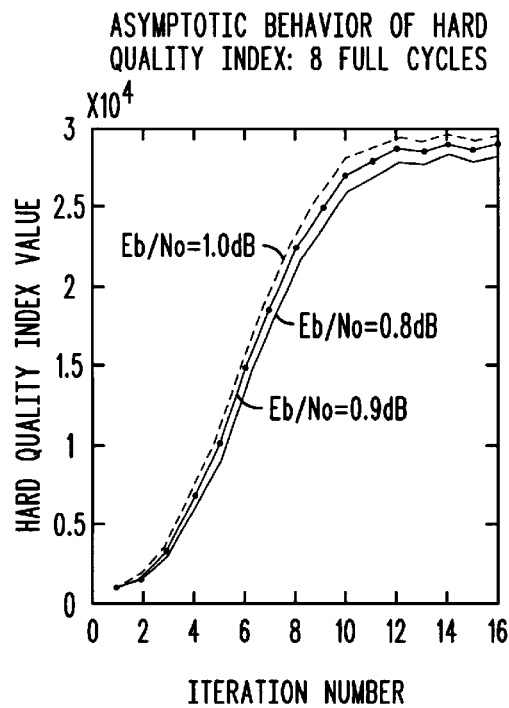
FIG. 10 shows a simulation results using turbo decoding.

FIG. 10 shows simulation results using the turbo decoding in accordance with the present invention. The performance of $Q_H(iter,\{m_i\},L)$ and $Q_S(iter,\{m_i\},L)$ were verified through numerical simulations. The simulation results are presented to demonstrate the asymptotic behavior of these indexes. Then the performance of the turbo decoder is shown given that the hard and soft indexes are being used as an iteration stopping criteria. The code used is the CDMA2000 standard code with code rate ⅓, G1=13 and G2=15, as recognized in the art. The simulation was run with 2000 frames of size 640 bits and the SNR points are 0.8 dB, 0.9 dB and 1.0 dB. Viterbi's memory cutting technique, known in the art for more realistic results, is implemented with synchronization learning length 30. The asymptotic behavior of the hard quality index $Q_H(iter,\{m_i\},L)$ and the soft quality index $Q_S(iter,\{m_i\},L)$ is depicted in FIGS. 10 and 11, respectively.

Figure 11:
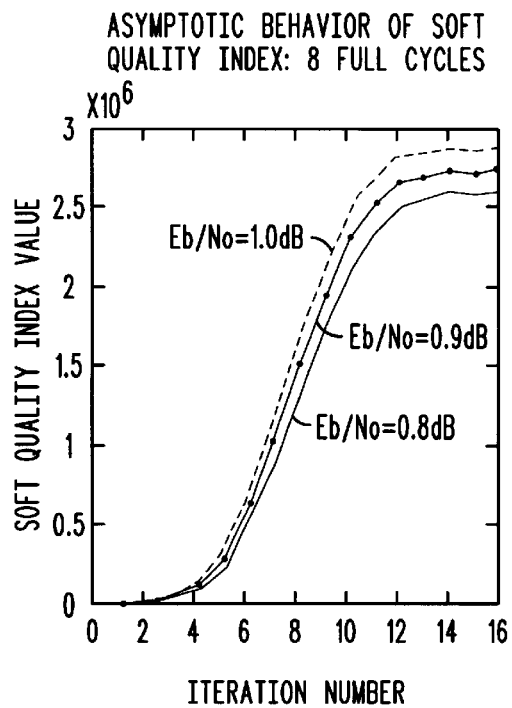
FIG. 11 shows a simulation results using turbo decoding.

FIGS. 10 and 11 shows that the slope of the asymptotic curves increases as the SNR gets higher. This is as expected since high SNR gives better extrinsic information in decoding. As can be seen, the quality indexes reach their asymptotes faster as SNR increases which means less iterations are needed for convergence. This property is valuable in reducing the number of computations in the present invention.

Figure 12:
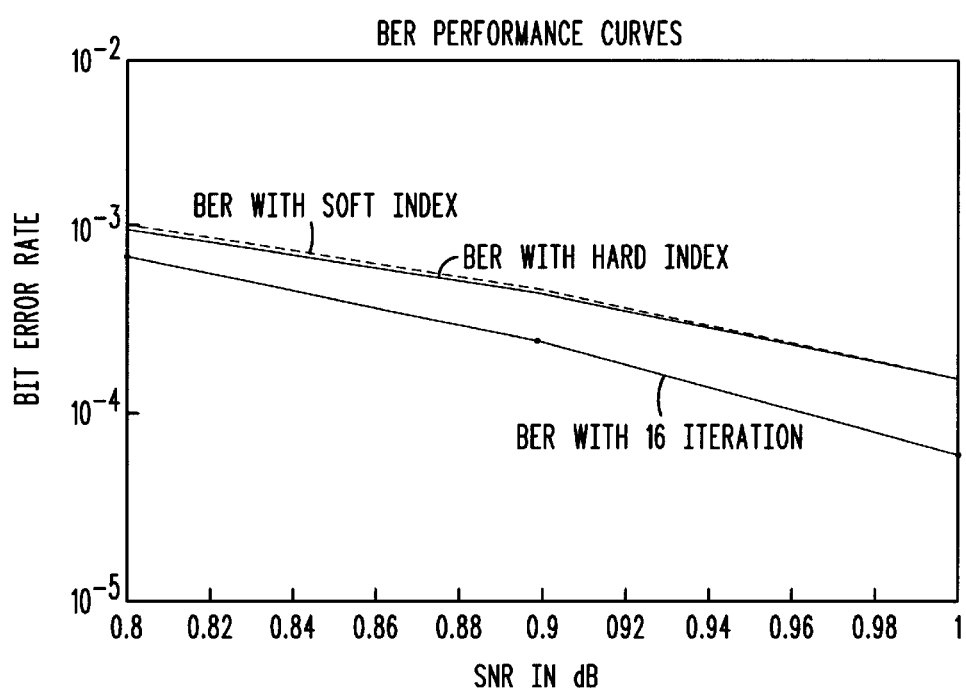
FIG. 12 shows a bit error rate performance curve simulation.

Due to the close relationship between intrinsic SNR and the quality indexes, the numerical results with the hard and soft intrinsic SNR has similar performance. FIG. 12 shows bit-error-rate BER performance curve simulation results using the turbo decoding in accordance with the present invention. The performance of the turbo decoder is shown given the intrinsic signal to noise ratio of the signal is being used as the signal quality criteria. All the results are under AWGN assumptions in floating and fixed point C format with Viterbi technique. The code used was the CDMA 2000 standard code with code rate ⅓, G1=13 and G2=15. Each figure is obtained from running 2000 frames of data with frame size 640 under AWGN channel and with SNR range 0.8 dB, 0.9 dB and 1.0 dB. The longest synchronization period was set to be 30 symbols. The largest iteration number used was 16, which is 8 full cycles. The synchronization period shrinking scheme of the present invention is applied after 4 mandatory iterations (i.e. 2 full cycles). Within each iteration, the synchronization period is reduced by certain number of symbols with a lower limit of 4 symbols of data as the minimum synchronization period (for the last stages of iteration). It is hypothesized that performance results will be improved if dynamic scaling or digital AGC is applied in the simulation. The results below were derived using 4-bit fixed point simulation results. Similar results were also obtained for floating point simulations which are not presented here.

Figure 13:
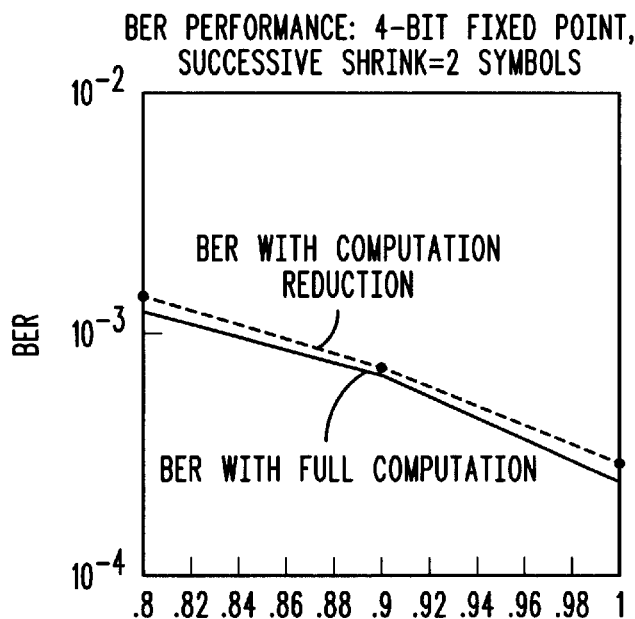
FIG. 13 shows a fixed point simulation.
Figure 14:
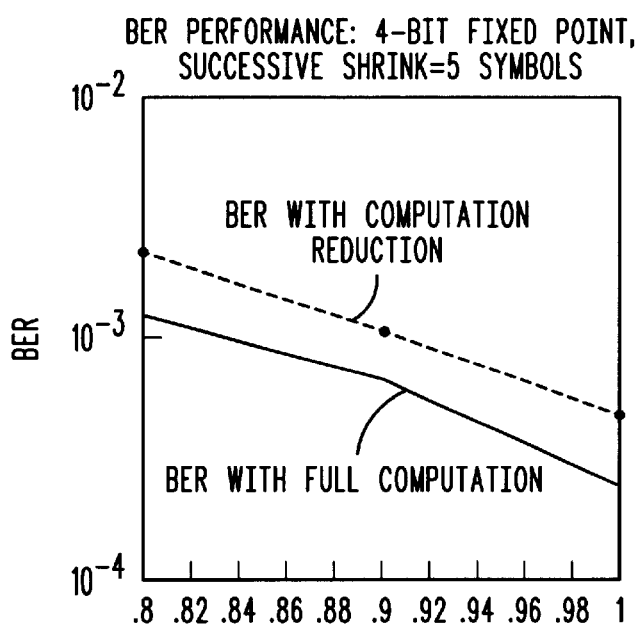
FIG. 14 shows a fixed point simulation.

FIG. 13 shows the 4-bit fixed point simulation results with successive shrinking of synchronization period by 2 symbols. In particular, four initial iterations (i.e. 2 full cycles) are performed having the longest synchronization period set to be 30 symbols. Afterwards the synchronization period is reduced by 2 symbols for each successive iteration until a minimum synchronization length of 4 symbols is reached and maintained. FIG. 14 shows the same simulation repeated but with successive shrinking of synchronization period by 5 symbols. We can see in FIGS. 13 and 14 that the performance degradation is small (negligible for 2-symbol case and less than 0.1 dB for 5-symbol case). In practice, the reduction of computation can be visualized as a "sleep mode" of the processors, wherein the backward computation is reduced by 16.25% if we successively shrink the synchronization period by 2 symbols and 26.77% if we shrink the synchronization period successively by 5 symbols. As a result, a significant savings of computations are obtained with only a small reduced in SNR. The total degradation in performance due to successive shrinking is summarized in the following table:

The previous plots show the improved performance provided by the successive shrinking of synchronization period, in accordance with the present invention. These results indicate that some of the computations in direct turbo decoding implementation actually do not contribute significantly to the decoder performance. The present invention introduces a variety of "sleep mode" to reduce the less significant computations with only a minor performance degradation. The percentage of computation reduction is virtually the percentage of "sleep" time of the backward recursive computation engines if the Viterbi technique is applied.

Figure 15:
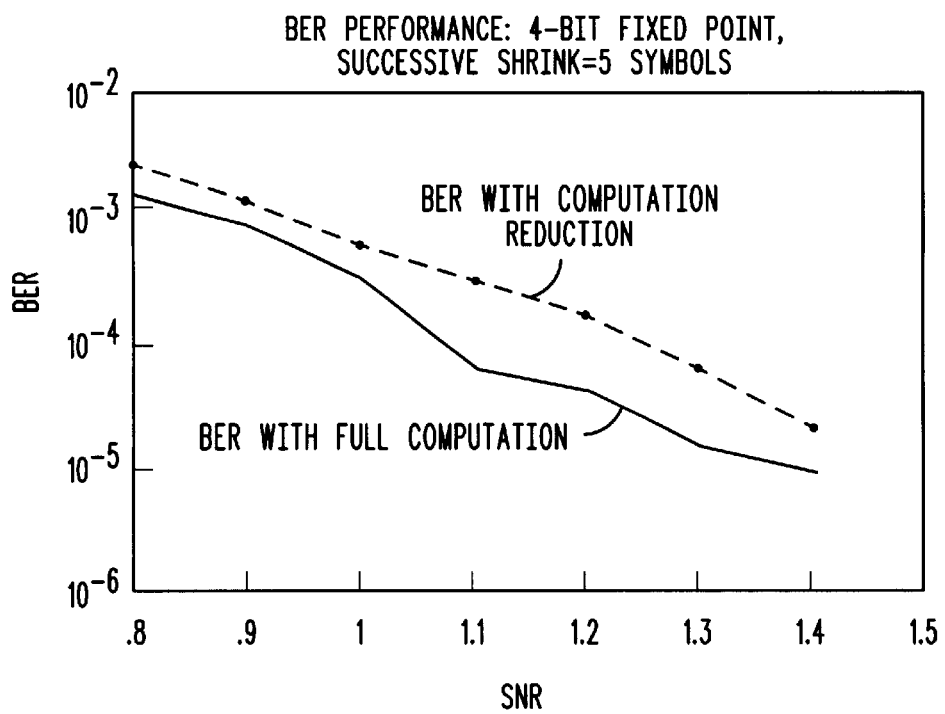
FIG. 15 shows a bit error rate performance curve simulation.

As the successive shrinking of the present invention is based on the intrinsic SNR value increase as iteration proceeds, the performance degradation with higher starting SNR will be smaller. This is illustrated in FIG. 15 showing expanded BER performance curves with 4-bit fixed point simulation. The plots are run with successive shrinking period of 5 symbols, which is considered as the "worst" case. Yet, the degradation is still less than 0.2 dB.

Figure 16:
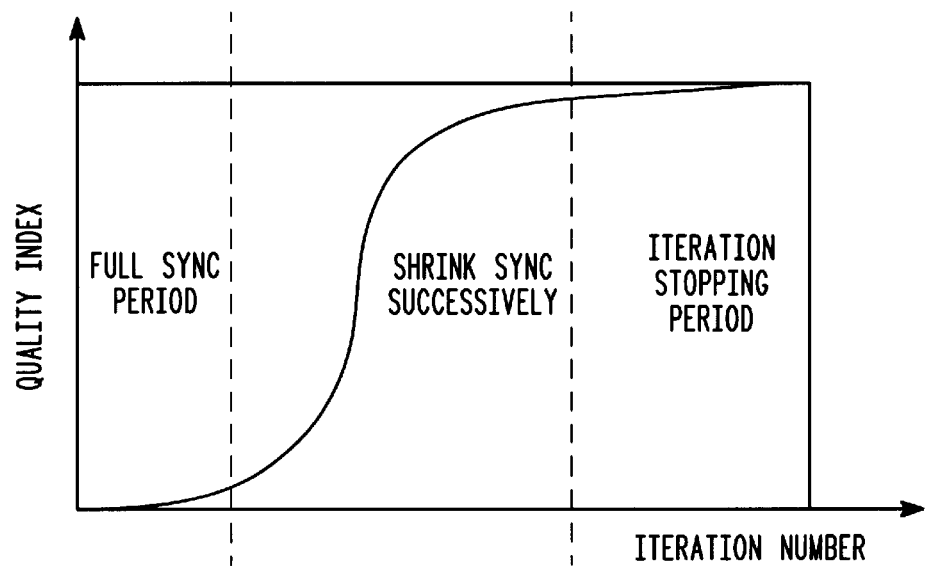
FIG. 16 shows overall timing operation of the turbo decoder.

FIG. 16 demonstrates the following overall timing operation of the turbo decoding process and three different regions of operation, in accordance with the present invention. The first portion is the full synchronization portion due to low intrinsic SNR. Viterbi's technique with random start was chosen in this first portion. In the second portion, shorter and shorter synchronization periods are applied with random start or with a sequence values with the quick increase of intrinsic SNR values. The third portion is the part with good intrinsic SNR and iteration can be stopped here. As a result a virtual "sleep mode" is introduced into the turbo decoder with combinations of all these different schemes. The amount of the computation is reduced, and the saving of power consumption is directly proportional to the sleeping period.

As can be seen from the previous example, the computation reduction techniques of the present invention are improvements of Viterbi's technique, and can be accomplished via very simple modification to existing turbo decoder configurations. In particular, one α engine and at least one β computation engine is used. All engines are run full time in parallel for a few iterations with random start (there is no α sequence or path metric information available due to the timing mechanism anyway). After a few iterations, the β engine(s) are kept idle for a while and the β computations are started with the assistance of available α sequence or random start values (depending on the timing and availability of the α sequence). This "sleep mode" is very easy to control based on the regular dual backward computation engine design.

As should be recognized, the hardware needed to implement quality indexes is extremely simple. Since there are LLR and extrinsic information output in each constituent decoding stage, only a MAC (multiply and accumulate unit) is needed to calculate the soft index. A comparison unit based on one subtraction and one division is needed. For the hard index, a slicer is needed for hard decision before the MAC. Advantageously, these indexes can be implemented with some simple attachment to the current design.

Figure 17:
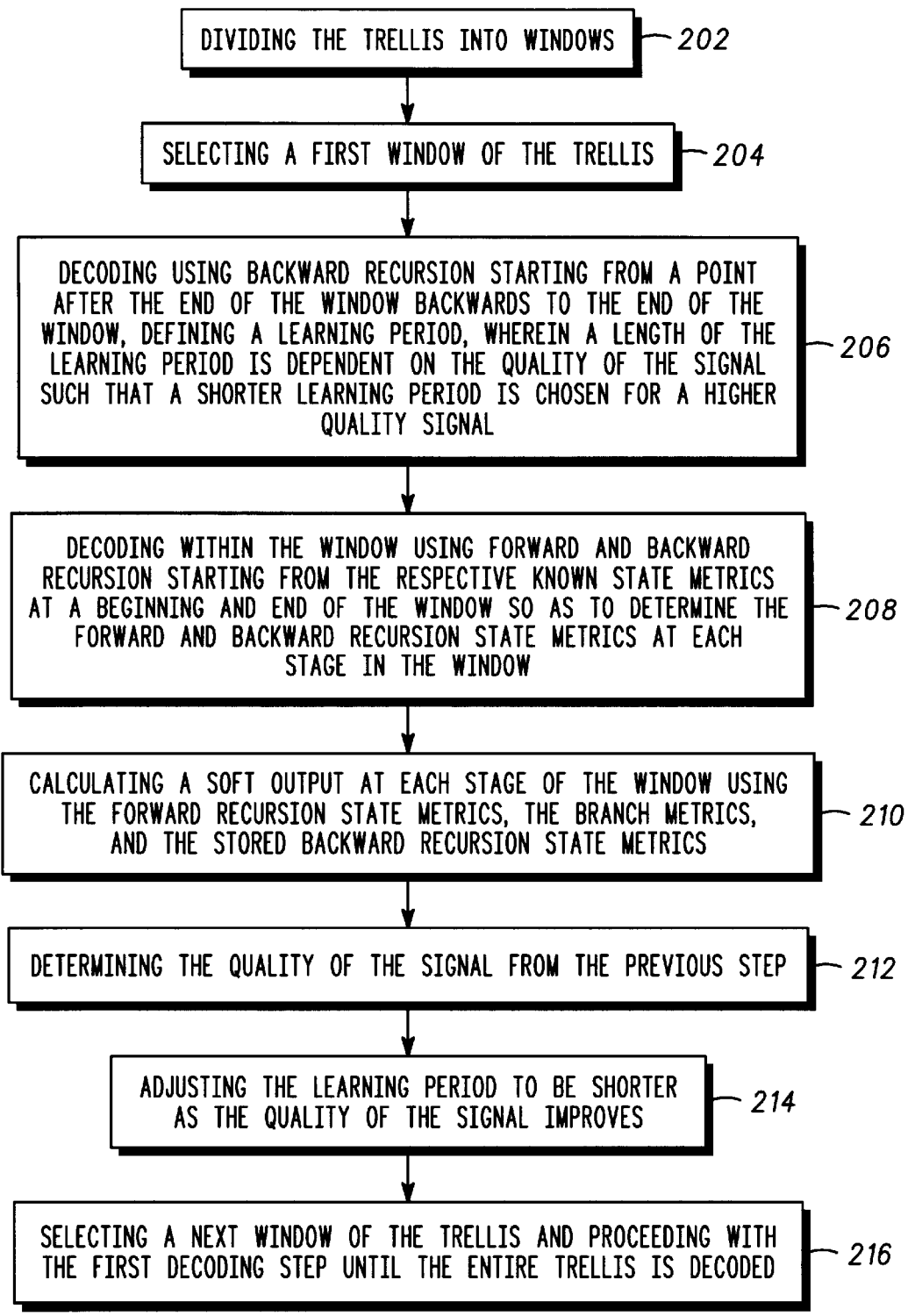
FIG. 17 is a flow chart representing a method of reducing calculations in the decoder.

FIG. 17 shows a flow chart representing a method 200 of reducing calculations in the decoding of a received convolutionally coded signal represented by a trellis of a predetermined block length, in accordance with the present invention (also see FIG. 6). Trellis diagrams are well known in the art. A first step 202 is dividing the trellis into windows. A next step 204 is selecting a first window of the trellis having a known first state metric. A next step 206 decoding a portion of the trellis using backward recursion starting from a point that is after the end of the window selected in the previous step backwards to the end of the window, defining a learning period, to determine a known state metric at the end of the window, wherein a length of the learning period is dependent on the quality of the signal such that a shorter learning period is chosen for a higher quality signal and a longer learning period is chosen for a lower quality signal. In general, it is only desired to shorten the learning period. A next step 208 is decoding a portion of the trellis within the window using forward and backward recursion starting from the respective known state metrics at a beginning and end of the window defined in the previous step so as to determine the forward and backward recursion state metrics at each stage in the window. A next step 210 is calculating a soft output at each stage of the window using the forward recursion state metrics, the branch metrics, and the stored backward recursion state metric. Preferably, the recursion updates and soft outputs are calculated using a SOVA or MAP algorithm or one of the MAP derivatives (i.e., log-MAP, max-log-MAP, constant-log-MAP, etc.). A next step 212 is determining the quality of the signal from the previous step. Preferably, the quality of the signal in the determining step is determined from an intrinsic signal-to-noise ratio of the signal defined as a summation of generated extrinsic information multiplied by a quantity extracted from log-likelihood-ratio (LLR) value at each iteration generated in the second decoding step. This can be a hard decision of the LLR value or the LLR value itself. A next step 214 is adjusting the learning period to be shorter as the quality of the signal improves and longer if the quality of the signal worsens. Preferably, the adjusting step includes an upper and a lower boundary for the length of the learning period, and the adjustment in the learning period is proportional to the change in the quality of the signal found in the determining step. A next step 216 is selecting a next window of the trellis and proceeding with the first decoding step until the entire trellis is decoded.

Once a window is completely decoded, the window can be "slided" forward a distance L where the beginning of the new window starts at the end of the last window so as to start at a previously determined known state. The above steps can then be repeated for the new window. This process continues until all of the windows in the block are processed. The first and last windows are a special case in that the beginning and ends of the block are usually at known states for the convolutional code. Therefore, when processing the first window, the forward recursion starts at the known first state of the block, and when processing the last window it is not necessary to perform a backward learning recursion as the end state of the window is the known end state of the block.

While specific components and functions of the decoder for convolutional codes are described above, fewer or additional functions could be employed by one skilled in the art within the broad scope of the present invention. The invention should be limited only by the appended claims.

What is claimed is:

1. A method of reducing calculations in the decoding of a received convolutionally coded signal represented by a trellis of a predetermined block length, the method comprising the steps of:
   a) dividing the trellis into windows;
   b) selecting a first window of the trellis having a known first state metric;
   c) decoding a portion of the trellis using backward recursion starting from a point that is after the end of the window selected in the previous step backwards to the end of the window, defining a learning period, to determine a known state metric at the end of the window, wherein a length of the learning period is dependent on the quality of the signal such that a shorter learning period is chosen for a higher quality signal and a longer learning period is chosen for a lower quality signal;

d) decoding a portion of the trellis within the window using forward and backward recursion starting from the respective known state metrics at a beginning and end of the window defined in the previous step so as to determine the forward and backward recursion state metrics at each stage in the window;

e) calculating a soft output at each stage of the window using the forward recursion state metrics, the branch metrics, and the stored backward recursion state metrics;

f) determining the quality of the signal from the previous step;

g) adjusting the learning period to be shorter as the quality of the signal improves and longer if the quality of the signal worsens; and h) selecting a next window of the trellis and proceeding with the steps c)–g) until the entire trellis is decoded.

2. The method of claim 1, wherein the adjusting step includes an upper and a lower boundary for the length of the learning period.

3. The method of claim 2, wherein the first decoding step includes an initial learning period being set at the upper boundary, and the adjusting step only allows for a shortening of the learning period as the quality of the signal improves.

4. The method of claim 1, wherein the adjusting step includes an initial learning period having a length of about five constraint lengths of the convolutional code.

5. The method of claim 1, wherein the adjusting step includes the adjustment in the learning period being proportional to the change in the quality of the signal found in the determining step.

6. The method of claim 1, wherein the quality of the signal in the determining step is determined from an intrinsic signal-to-noise ratio of the signal defined as a summation of generated extrinsic information multiplied by a quantity extracted from log-likelihood-ratio (LLR) value at each iteration generated in the second decoding step.

7. The method of claim 6, wherein the determining step includes the extracted quantity being a hard decision of the LLR value.

8. The method of claim 6, wherein the determining step includes the extracted quantity being the LLR value itself.

9. The method of claim 1, further comprising the step of providing a turbo decoder with two recursion processors connected in an iterative loop, and at least one additional recursion processor coupled in parallel at the inputs of at least one of the recursion processors, all of the recursion processors concurrently performing iteration calculations on the signal, and wherein the quality of the signal in the determining step is derived from a log-likelihood-ratio generated by the at least one recursion processor.

10. The method of claim 9, wherein the providing step includes the at least one additional recursion processor being a Viterbi decoder, and the two recursion processors are soft-input, soft-output decoders.

11. The method of claim 1, wherein the decoding steps include a generalized Viterbi algorithm for the decoding steps.

12. The method of claim 1, wherein the calculating step uses a maximum a posteriori (MAP) algorithm to calculate the soft output at each stage, wherein the MAP algorithm includes one of the group of a log-MAP, MAP, max-log-MAP, and constant-log-MAP algorithm.

13. A method of reducing calculations in the decoding of a received convolutionally coded sequence of signals represented by a trellis of a predetermined block length, the method comprising the steps of:

a) dividing the trellis into windows;

b) selecting a first window of the trellis having a known first state metric;

c) decoding a portion of the trellis using backward recursion starting from a point that is after the end of the window selected in the previous step backwards to the end of the window, defining a learning period, to determine a known state metric at the end of the window, wherein a length of the learning period is dependent on an intrinsic signal-to-noise ratio of the signal such that the learning period is shortened as the intrinsic signal-to-noise ratio of the signal improves;

d) decoding a portion of the trellis within the window using forward and backward recursion starting from the respective known state metrics at a beginning and end of the window defined in the previous step so as to determine the forward and backward recursion state metrics at each stage in the window;

e) calculating a soft output at each stage of the window using the forward recursion state metrics, the branch metrics, and the stored backward recursion state metrics;

f) determining the intrinsic signal-to-noise ratio of the signal defined as a summation of generated extrinsic information multiplied by a log-likelihood-ratio (LLR) value at each iteration generated in the second decoding step;

g) adjusting the learning period from an initial upper boundary to be shorter as the quality of the signal improves but not more than a lower boundary; and h) selecting a next window of the trellis and proceeding with the steps c)–g) until the entire trellis is decoded.

14. A radiotelephone with a receiver and demodulator with a soft-decision output decoder for serially processing windows of a convolutionally coded signal, represented by a trellis of predetermined block length divided into windows in a frame buffer, the soft-decision output decoder comprising:

a memory;

a learning recursion processor decodes a portion of the trellis using a learning backward recursion from a point that is after the end of a window backward to the end of the window, defining a learning period, to determine a known state metric at the end of the window;

a backward recursion processor subsequently decodes the portion of the trellis within the window using backward recursion from the known state at the end of the window back to the beginning of the window to define a set of known backward recursion state metrics within the window which can be stored in the memory;

a forward recursion processor decodes the portion of the trellis within the window using forward recursion starting from a known state at the beginning of the window and moving forward to define a set of known forward recursion state metrics within the window which can be stored in the memory; and a decoder coupled to the memory calculates a soft output at each stage of the window using the forward and backward recursion state metrics and branch metrics at each stage, the decoder also determines a quality of the signal for each window and adjusts the learning period for processing a next window to be shorter as the quality of the signal improves and longer if the quality of the signal worsens.

15. The radiotelephone of claim 14, wherein an initial learning period is set at the upper boundary, and the decoder only allows for a shortening of the learning period, as the quality of the signal improves, to not less than a lower boundary.

16. The radiotelephone of claim 14, wherein the adjustment of the learning period is proportional to the change in the quality of the signal.

17. The radiotelephone of claim 14, wherein the quality of the signal in the is determined from an intrinsic signal-to-noise ratio of the signal defined as a summation of generated extrinsic information multiplied by a quantity extracted from log-likelihood-ratio (LLR) value at each iteration generated in the decoder.

18. The radiotelephone of claim 17, wherein the extracted quantity is one of the group of a hard decision of the LLR value and the LLR value itself.

19. The radiotelephone of claim 11, wherein the processors use a generalized Viterbi algorithm.

20. The radiotelephone of claim 11, wherein the decoder uses a maximum a posteriori (MAP) algorithm to calculate the soft output at each stage, wherein the MAP algorithm includes one of the group of a log-MAP, MAP, max-log-MAP, and constant-log-MAP algorithm.

* * * * *